US009905332B2

(12) United States Patent
Jacquemond et al.

(10) Patent No.: US 9,905,332 B2
(45) Date of Patent: Feb. 27, 2018

(54) TRANSPARENT CONDUCTIVE ELECTRODE AND ASSOCIATED PRODUCTION METHOD

(71) Applicant: HUTCHINSON, Paris (FR)

(72) Inventors: Jérémie Jacquemond, Montargis (FR); Stéphane Roger, Saint Maurice sur Fessard (FR); Bruno Dufour, Champagne sur Seine (FR); Philippe Sonntag, Avon (FR)

(73) Assignee: Hutchinson, Paris (FR)

( * ) Notice: Subject to any disclaimer, the term of this patent is extended or adjusted under 35 U.S.C. 154(b) by 211 days.

(21) Appl. No.: 14/433,314

(22) PCT Filed: Oct. 2, 2013

(86) PCT No.: PCT/EP2013/070591
§ 371 (c)(1),
(2) Date: Apr. 2, 2015

(87) PCT Pub. No.: WO2014/053572
PCT Pub. Date: Apr. 10, 2014

(65) Prior Publication Data
US 2015/0262730 A1    Sep. 17, 2015

(30) Foreign Application Priority Data

Oct. 3, 2012    (FR) ..................... 12 59359

(51) Int. Cl.
*H01B 5/14*    (2006.01)
*H01L 51/44*    (2006.01)
(Continued)

(52) U.S. Cl.
CPC ........... *H01B 5/14* (2013.01); *C03C 17/3405* (2013.01); *H01B 1/127* (2013.01); *H01L 51/442* (2013.01);
(Continued)

(58) Field of Classification Search
CPC ......... H01B 5/14; H01B 1/127; H01L 51/442; H01L 51/5215; H01L 51/0037; C03C 17/3405
(Continued)

(56) References Cited

U.S. PATENT DOCUMENTS 6,261,722 B1    7/2001  Dasgupta et al.
6,830,814 B1 *  12/2004 Knoll ................ G02F 1/133711
                                                     427/508
(Continued)

FOREIGN PATENT DOCUMENTS

EP        0867902 A2      9/1988
EP        0 948 005 A1   10/1999
(Continued)

OTHER PUBLICATIONS

Chinese Office Action (with English Translation) dated Nov. 30, 2016 corresponding to Chinese Application No. 201380061839.X; 16 Pages.
(Continued)

*Primary Examiner* — Michael M Bernshteyn
(74) *Attorney, Agent, or Firm* — Daly, Crowley, Mofford & Durkee, LLP

(57) ABSTRACT

The present invention relates to a multilayer conductive transparent electrode comprising:
  a substrate layer (1),
  a conductive layer (2) comprising at least one optionally substituted polythiophene conductive polymer, and
the conductive layer (2) being in direct contact with the substrate layer (1) and the conductive layer (2) also comprising at least one hydrophobic adhesive polymer which has chemical compatibility with the optionally substituted polythiophene conductive polymer, such that said multilayer conductive transparent electrode has a coefficient of haze of
(Continued)

Figure 1:
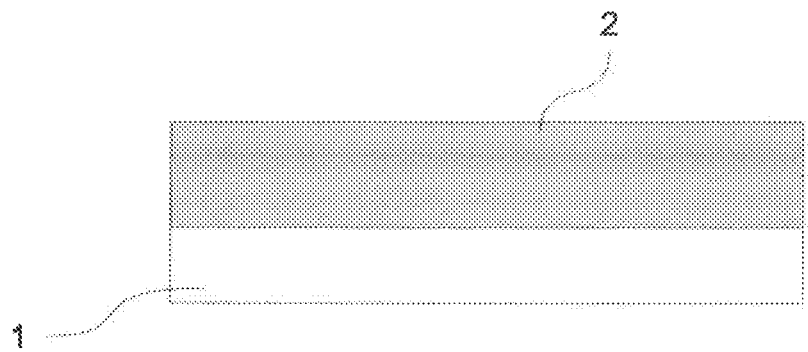

less than or equal to 3%. The invention also relates to the process for manufacturing such a multilayer conductive transparent electrode.

11 Claims, 2 Drawing Sheets

(51) Int. Cl.
*H01L 51/52* (2006.01)
*C03C 17/34* (2006.01)
*H01B 1/12* (2006.01)
*H01L 51/00* (2006.01)

(52) U.S. Cl.
CPC ...... *H01L 51/5215* (2013.01); *H01L 51/0037* (2013.01); *Y02E 10/549* (2013.01); *Y02P 70/521* (2015.11)

(58) Field of Classification Search
USPC .................................................. 428/411.1
See application file for complete search history.

(56) References Cited

U.S. PATENT DOCUMENTS

| | | | |
|---|---|---|---|
| 2002/0196597 A1 | 12/2002 | Volfkovich et al. | |
| 2006/0292384 A1 | 12/2006 | Kazaryan et al. | |
| 2007/0231604 A1* | 10/2007 | Ohkubo | C08G 61/122 428/704 |
| 2008/0237547 A1* | 10/2008 | Yasuda | H01B 1/08 252/500 |
| 2009/0092747 A1 | 4/2009 | Zhamu et al. | |
| 2010/0255323 A1* | 10/2010 | Nakamura | H01B 1/22 428/457 |
| 2011/0052926 A1 | 3/2011 | Nakamura et al. | |
| 2012/0138913 A1* | 6/2012 | Alsayed | B22F 1/0025 257/40 |

FOREIGN PATENT DOCUMENTS

| | | | | |
|---|---|---|---|---|
| EP | 2 461 649 A1 | 6/2012 | | |
| EP | 2461649 A1 * | 6/2012 | ......... | H01L 51/5206 |
| JP | 2009-205924 | 9/2009 | | |
| JP | 2009205924 A * | 9/2009 | | |
| JP | 2010-2444747 | 10/2010 | | |
| JP | 2012-009359 | 1/2012 | | |
| JP | 2012009359 A * | 1/2012 | ............ | B82Y 20/00 |
| WO | WO 2001/06306 A2 | 1/2001 | | |
| WO | WO 0106306 A2 * | 1/2001 | ........ | G02F 1/133711 |
| WO | WO 2007/097564 A1 | 8/2007 | | |
| WO | WO 2007097564 A1 * | 8/2007 | ............ | C08J 5/2256 |
| WO | WO 2008/103681 A1 | 8/2008 | | |
| WO | WO 2010/112680 A1 | 10/2010 | | |
| WO | WO 2010/130986 A1 | 11/2010 | | |
| WO | WO 2011/077804 A1 | 6/2011 | | |
| WO | WO 2011077804 A1 * | 6/2011 | ......... | H01L 51/0021 |
| WO | WO 2012/124647 A1 | 9/2012 | | |
| WO | WO 2012124647 A1 * | 9/2012 | .......... | H01L 51/102 |
| WO | WO 2013004666 A1 | 1/2013 | | |
| WO | WO 2013004667 A1 | 1/2013 | | |
| WO | WO 2014/053574 A2 | 4/2014 | | |
| WO | WO 2014053572 A2 | 4/2014 | | |
| WO | WO 2014053574 A2 | 4/2014 | | |
| WO | WO 20141053574 A3 | 4/2014 | | |

OTHER PUBLICATIONS

Internatbnal Search Report of the ISA for PCT/EP2013/070591 dated May 26, 2014.
International Search Report of the ISA for PCT/EP2013/070593 dated May 26, 2014.
International Search Report of the ISA dated Aug. 28, 2012 for PCT/EP2012/062853; 5 pages.
English Translation of Written Opinion for PCT/EP2012/062853; 6 pages.
English Translation of U.S. Appl. No. 14/130,156, filed May 14, 2014; 39 pages.
Preliminary Amendment dated Dec. 30, 2013 for U.S. Appl. No. 14/130,156; 7 pages.
International Search Report of the ISA dated Nov. 20, 2012 for PCT/EP2012/062848; 7 pages.
English Translation of Written Opinion for PCT/EP2012/062848, 12 pages.
English Translation of U.S. Appl. No. 14/130,159, filed Feb. 4, 2014, 28 pages.
Preliminary Amendment dated Dec. 30, 2013 for U.S. Appl. No. 14/130,159; 7 pages.
Office Action dated Nov. 9, 2015 for U.S. Appl. No. 14/130,159; 12 pages.
Response to Office Action filed on Feb. 9, 2016 for U.S. Appl. No. 14/130,159; 14 pages.
English Translation of Written Opinion for PCT/EP2013/070593 dated May 26, 2014; 10 pages.
Preliminary Amendment dated Apr. 2, 2015 for U.S. Appl. No. 14/433,313; 8 pages.
English Translation of Written Opinion for PCT/EP2013/070591 dated May 26, 2014; 10 pages.
Preliminary Amendment dated Apr. 2, 2015 for U.S. Appl. No. 14/433,314; 7 pages.
English Translation of Written Opinion for PCT/EP2012/062853 dated Aug. 28, 2012; 6 pages.
English Translation of Written Opinion for PCT/EP2012/062848 dated Nov. 20, 2012; 12 pages.
Notice of Allowance dated Apr. 22, 2016 for U.S. Appl. No. 14/130,159; 13 pages.
Restriction Requirement dated Aug. 24, 2017 for U.S. Appl. No. 14/433,313; 8 pages.
Response to Restriction Requirement dated Aug. 24, 2017 for U.S. Appl. No. 14/433,313, filed Sep. 26, 2017; 1 page.
Translation of Preliminary Notice of Reasons for Rejection for Japanese Patent Appl. No. 2015-535013; dated Oct. 30, 2017; 5 pages.

* cited by examiner

TRANSPARENT CONDUCTIVE ELECTRODE AND ASSOCIATED PRODUCTION METHOD

This application is a U.S. National Stage of PCT application PCT/EP2013/070591 filed in the French language on Oct. 2, 2013, and entitled "TRANSPARENT CONDUCTIVE ELECTRODE AND ASSOCIATED PRODUCTION METHOD," which claims priority to French application FR1259359 filed Oct. 3, 2012 which application is incorporated herein by reference.

The present invention relates to a conductive transparent electrode and also to the process for manufacturing the same, in the general field of organic electronics.

Conductive transparent electrodes having both high transmittance and electrical conductivity properties are currently the subject of considerable development in the field of electronic equipment, this type of electrode being increasingly used for devices such as photovoltaic cells, liquid-crystal screens, organic light-emitting diodes (OLED) or polymeric light-emitting diodes (PLED) and touch screens.

There is at the present time a substantial need in the field of electronics and in particular of organic electronics, for electrodes which have both good transmittance, greater than 75%, and high conductivity (surface resistance at least less than $1000\Omega/\square$). For applications as mentioned above, it is necessary to have a surface of low roughness, less than 20 nm, and a low coefficient of haze.

In order to obtain conductive transparent electrodes which have high transmittance and electrical conductivity properties, it is known practice to have a multilayer conductive transparent electrode comprising in a first stage a substrate layer on which are deposited an adhesion layer, a percolating network of metal nanofilaments and an encapsulation layer made of conductive polymer, for instance a poly(3,4-ethylenedioxythiophene) (PEDOT) and sodium poly(styrene sulfonate) (PSS) mixture, forming what is known as PEDOT: PSS.

Patent application US 2009/129004 describes a multilayer transparent electrode that can achieve good transmittance and low surface resistivity. However, such an electrode has a complex architecture, with a substrate layer, an adhesion layer, a layer consisting of metal nanofilaments, a conductive layer consisting of carbon nanotubes, a conductive polymer and an elastomer. This addition of layers entails a substantial cost for the process.

Furthermore, the material is also heterogeneous, which entails high roughness and a high coefficient of haze. Finally, the conductive layer is based on carbon nanotubes, which pose dispersion problems, and thus entails the presence of optical defects.

It is thus desirable to develop a conductive transparent electrode comprising fewer layers, and not comprising any carbon nanotubes.

A less expensive approach exists, which consists of a simple mixture of a conductive polymer, such as PEDOT/PSS, with a flexible polymer, as described in Sun et al., Progress in Organic Coatings, 59 (2007), 115-121 and Yin et al., Journal of Materials Chemistry, 2012, 22, 3800. However, these articles show by microscopy that the mixtures are not homogeneous, there is a phase separation between the conductive polymer and the flexible polymer. As a result, these composites consist of a continuous network of conductive polymer in a flexible polymer matrix. However, the composites obtained via this method described in these articles have a high coefficient of haze and substantial surface roughness.

One of the aims of the invention is thus to at least partially overcome the prior art drawbacks and to propose a multilayer conductive transparent electrode which has low roughness and also a low coefficient of haze, and also a process for manufacturing the same.

The present invention thus relates to a multilayer conductive transparent electrode comprising:
  a substrate layer,
  a conductive layer comprising at least one optionally substituted polythiophene conductive polymer, and
the conductive layer being in direct contact with the substrate layer and the conductive layer also comprising at least one hydrophobic adhesive polymer which has chemical compatibility with the optionally substituted polythiophene conductive polymer, such that said multilayer conductive transparent electrode has a coefficient of haze of less than or equal to 3%.

The multilayer conductive transparent electrode according to the invention satisfies the following requirements and properties:
  a surface electrical resistance R of less than or equal to $1000\Omega/\square$ and greater than or equal to $50\ \Omega/\square$,
  a mean transmittance $T_{mean}$ in the visible spectrum of greater than or equal to 75%,
  a coefficient of haze of less than or equal to 3%,
  a roughness of less than 20 nm,
  direct adhesion to the substrate,
  absence of phase separation between the components of the conductive layer.

According to one aspect of the invention, the conductive layer also comprises at least one additional polymer.

According to another aspect of the invention, the additional polymer is polyvinylpyrrolidone.

According to another aspect of the invention, the multilayer conductive transparent electrode has a mean transmittance in the visible spectrum of greater than or equal to 75%.

According to another aspect of the invention, the multilayer conductive transparent electrode has a roughness of less than 20 nm.

According to another aspect of the invention, the multilayer conductive transparent electrode has a surface resistance of less than or equal to $1000\Omega/\square$ and greater than or equal to $50\ \Omega/\square$.

According to another aspect of the invention, the substrate is chosen from glass and transparent flexible polymers.

According to another aspect of the invention, the adhesive polymer comprises side-chain ester functions.

According to another aspect of the invention, the hydrophobic adhesive polymer is chosen from polyvinyl acetates and acrylic polyesters.

The invention also relates to a process for manufacturing a multilayer conductive transparent electrode, comprising the following steps:
  a step of preparing a composition forming the conductive layer, comprising:
    at least one optionally substituted polythiophene conductive polymer,
    at least one hydrophobic adhesive polymer which has chemical compatibility with the optionally substituted polythiophene conductive polymer such that said multilayer conductive transparent electrode has a coefficient of haze of less than or equal to 3%,
  a step of applying and drying the composition forming the conductive layer directly on a substrate layer,
  a step of crosslinking the conductive layer.

According to one aspect of the process according to the Invention, the composition forming the conductive layer also comprises at least one additional polymer.

According to another aspect of the process according to the invention, the additional polymer is polyvinylpyrrolidone.

According to another aspect of the process according to the invention, the substrate of the substrate layer is chosen from glass and transparent flexible polymers.

According to another aspect of the process according to the invention, the adhesive polymer comprises side-chain ester functions.

According to another aspect of the process according to the invention, the adhesive polymer is chosen from polyvinyl acetates and acrylic polyesters.

Figure 2:
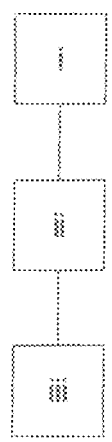
Figure 3A:
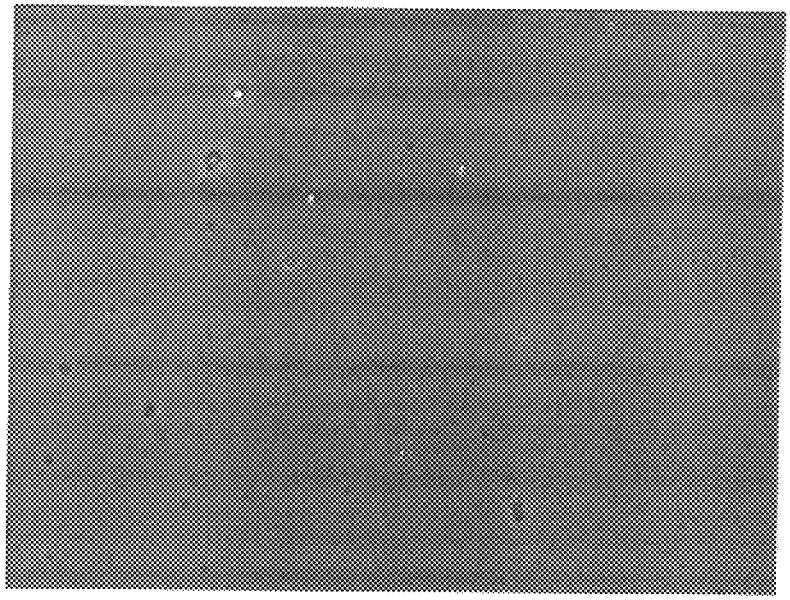
Figure 3B:
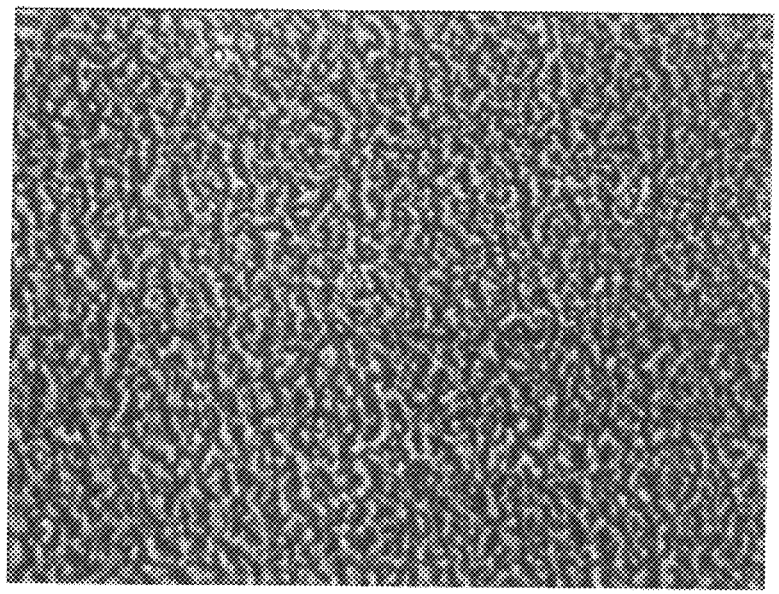

Further characteristics and advantages of the invention will emerge more clearly from reading the following description, which is given as a nonlimiting illustrative example, and from the attached drawings, among which:

FIG. 1 is a schematic representation in cross section of the various layers of the multilayer conductive transparent electrode, FIG. 2 is a flow diagram of the various steps of the manufacturing process according to the invention, FIG. 3A is an electronic microscope photograph in top view of a multilayer conductive transparent electrode not showing any phase separation between the polymers of the conductive layer, and FIG. 3B is an electron microscope photograph in top view of a multilayer conductive transparent electrode showing phase separation between the polymers of the conductive layer.

The present invention relates to a multilayer conductive transparent electrode, illustrated in FIG. 1. This type of electrode preferably has a thickness of between 0.05 µm and 20 µm.

Said multilayer conductive transparent electrode comprises:
 a substrate layer 1, and
 a conductive layer 2 in direct contact with the substrate layer 1.

In order to preserve the transparent nature of the electrode, the substrate layer 1 must be transparent. It may be flexible or rigid and advantageously chosen from glass in the case where it must be rigid, or alternatively chosen from transparent flexible polymers such as polyethylene terephthalate (PET), polyethylene naphthalate (PEN), polyether sulfone (PES), polycarbonate (PC), polysulfone (PSU), phenolic resins, epoxy resins, polyester resins, polyimide resins, polyetherester resins, polyetheramide resins, poly(vinyl acetate), cellulose nitrate, cellulose acetate, polystyrene, polyolefines, polyamide, aliphatic polyurethanes, polyacrylonitrile, polytetrafluoroethylene (PTFE), polymethyl methacrylate (PMMA), polyacrylate, polyetherimides, polyether ketones (PEK), polyether ether ketones (PEEK) and polyvinylidene fluoride (PVDF), the flexible polymers that are the most preferred being polyethylene terephthalate (PET), polyethylene naphthalate (PEN) and polyether sulfone (PES).

The conductive layer 2 comprises:
 (a) at least one optionally substituted polythiophene conductive polymer,
 (b) at least one hydrophobic adhesive polymer which has chemical compatibility with the optionally substituted polythiophene conductive polymer, such that said multilayer conductive transparent electrode has a coefficient of haze of less than or equal to 3%. The fact that the adhesive polymer is hydrophobic precisely allows good chemical compatibility the optionally substituted polythiophene conductive polymer, since the latter is also hydrophobic.

The conductive layer 2 may also comprise:
 (c) at least one additional polymer.

The conductive polymer (a) is a polythiophene, the latter being one of the most thermally and electronically stable polymers. A preferred conductive polymer is poly(3,4-ethylenedioxythiophene)-poly(styrenesulfonate) (PEDOT:PSS), the latter being stable to light and heat, easy to disperse in water, and not having any environmental drawbacks.

The adhesive polymer (b) shows good chemical compatibility with the optionally substituted polythiophene conductive polymer such that the multilayer conductive transparent electrode has a coefficient of haze of less than or equal to 3%. For this, the adhesive polymer (b) may advantageously comprise side-chain ester functions, and more particularly said adhesive polymer (b) may be chosen from polyvinyl acetates and acrylic polyesters.

The additional polymer (c) is chosen from polyvinyl alcohols (PVOH), polyvinylpyrrolidones (PVP), polyethylene glycols, or alternatively ethers and esters of cellulose or other polysaccharides. This additional polymer (c) is a viscosity-enhancing agent and aids the formation of a good-quality film during the application of the conductive layer 2 to the substrate layer 1.

The conductive layer 2 may comprise each of the constituents (a), (b) and (c) in the following weight proportions (for a total of 100% by weight):
 (a) from 10% to 65% by weight of at least one optionally substituted polythiophene conductive polymer,
 (b) from 20% to 90% by weight of at least one adhesive polymer or adhesive copolymer,
 (c) and from 0 to 15% by weight of at least one additional polymer.

The multilayer conductive transparent electrode according to the invention thus comprises:
 a surface electrical resistance R of less than or equal to 1000Ω/□ and greater than or equal to 50Ω/□, a mean transmittance $T_{mean}$ in the visible spectrum of greater than or equal to 75%,
 a coefficient of haze of less than or equal to 3%,
 a roughness of less than 20 nm,
 direct adhesion of the conductive layer 2 to the substrate layer 1,
 absence of phase separation between the components of the conductive layer 2, and
 absence of a network of metal nanofilaments.

The present invention also relates to a process for manufacturing a multilayer conductive transparent electrode, comprising the following steps:

The steps of the manufacturing process are illustrated in the flow diagram of FIG. 2.

i) Preparation of a Composition Forming the Conductive Layer 2

A composition forming the conductive layer 2 is prepared in this step i.

The composition forming the conductive layer 2 is obtained by mixing:
 (a) at least one optionally substituted polythiophene conductive polymer, and
 (b) at least one hydrophobic adhesive polymer or adhesive copolymer.

The conductive layer 2 may also comprise:
 (c) at least one additional polymer.

The preparation of the composition forming the conductive layer may comprise successive steps of mixing and stirring, for example using a magnetic stirrer as illustrated in the composition examples of examples A and B described hereinbelow in the experimental section.

The conductive polymer (a) is a polythiophene, said polymer being one of the most thermally and electronically stable polymers. A preferred conductive polymer is poly(3,4-ethylenedioxythlophene)-poly(styrenesulfonate) (PEDOT: PSS), the latter being stable to light and heat, easy to dispense in water, and not having any environmental drawbacks.

The conductive polymer (a) may be in the form of a dispersion or a suspension in water and/or in a solvent, said solvent preferably being a polar organic solvent chosen from dimethyl sulfoxide (DMSO), N-methyl-2-pyrrolidone (NMP), ethylene glycol, tetrahydrofuran (THF), dimethyl acetate (DMAc), dimethylformamide (DMF), the hydrophobic adhesive polymer (b) preferably being in dispersion or in suspension in water, dimethyl sulfoxide (DMSO) or ethylene glycol.

The hydrophobic adhesive polymer (b) must have good chemical compatibility with the optionally substituted polythiophene conductive polymer such that the multilayer conductive transparent electrode has a coefficient of haze of less than or equal to 3%. For this, the hydrophobic adhesive polymer (b) may advantageously comprise side-chain ester functions, and more particularly said hydrophobic adhesive polymer (b) may be chosen from polyvinyl acetates and acrylic polyesters.

The additional polymer (c) is chosen from polyvinyl alcohols (PVOH), polyvinylpyrrolidones (PVP), polyethylene glycols, or ethers and esters of cellulose or other polysaccharides. This additional polymer (c) is a viscosity-enhancing agent and aids the formation of a good-quality film during the application of the conductive layer 2 to the substrate layer 1.

The additional polymer (c) may be in the form of a dispersion or a suspension in water and/or in a solvent, said solvent preferably being an organic solvent chosen from dimethyl sulfoxide (DMSO), N-methyl-2-pyrrolidone (NMP), ethylene glycol, tetrahydrofuran (THF), dimethyl acetate (DMAc) or dimethylformamide (DMF).

ii) Application and Drying of the Conductive Layer 2 to a Substrate Layer 1

In this step ii, the composition forming the conductive layer 2 is applied directly onto a substrate layer 1, according to any method known to those skilled in the art, the techniques most commonly used being spray coating, inkjet coating, dip coating, film-spreader coating, spincoating, coating by impregnation, slot-die coating, scraper coating, or flexographic coating.

In order to preserve the transparent nature of the electrode, this substrate 1 must be transparent. It may be flexible or rigid and advantageously chosen from glass in the case where it must be rigid, or alternatively chosen from transparent flexible polymers such as polyethylene terephthalate (PET), polyethylene naphthalate (PEN), polyether sulfone (PES), polycarbonate (PC), polysulfone (PSU), phenolic resins, epoxy resins, polyester resins, polyimide resins, polyetherester resins, polyetheramide resins, poly(vinyl acetate), cellulose nitrate, cellulose acetate, polystyrene, polyolefines, polyamide, aliphatic polyurethanes, polyacrylonitrile, polytetrafluoroethylene (PTFE), polymethyl methacrylate (PMMA), polyacrylate, polyetherimides, polyether ketones (PEK), polyether ether ketones (PEEK) and polyvinylidene fluoride (PVDF), the flexible polymers that are the most preferred being polyethylene terephthalate (PET), polyethylene naphthalate (PEN) and polyether sulfone (PES).

After the application of the conductive layer 2, drying of this layer is performed. This drying may be performed at a temperature of between 20 and 50° C. in air for 1 to 45 minutes.

iii) Crosslinking of the Conductive Layer 2

During this step 111, crosslinking of the conductive layer 2 is performed, for example, by vulcanization at a temperature of 150° C. for a time of 5 minutes.

The solvents of the composition forming the conductive layer 2 are evaporated off during this crosslinking.

After crosslinking, the conductive layer 2 may comprise each of the constituents (a), (b) and (c) in the following weight proportions (for a total of 100% by weight):
  (a) from 10% to 65% by weight of at least one optionally substituted polythiophene conductive polymer,
  (b) from 20% to 90% by weight of at least one hydrophobic adhesive polymer or adhesive copolymer,
  (c) from 0 to 15% by weight of at least one dissolution of additional polymer.

The following experimental results show values obtained by a multilayer conductive transparent electrode according to the invention, for essential parameters such as the transmittance at a wavelength of 550 nm $T_{550}$, the mean transmittance $T_{mean}$, the surface electrical resistance R, the surface roughness, the coefficient of haze, and also the presence or absence of phase separation between the components of the conductive layer 2.

These results are placed in connection with values obtained for multilayer conductive transparent electrodes derived from a counterexample using an adhesive polymer not having any chemical compatibility with the conductive polymer.

1) MEASUREMENT METHODOLOGY

Measurement of the Total Transmittance

The total transmittance, i.e. the light intensity crossing the film over the visible spectrum, is measured on 50×50 mm specimens using a Perkin Elmer Lambda 35 © spectrophotometer on a UV-visible spectrum [300 nm-900 nm].
Two transmittance values are recorded:
  the transmittance value at 550 nm $T_{550}$, and
  the mean transmittance value $T_{mean}$ over the entire visible spectrum, this value corresponding to the mean value of the transmittances over the visible spectrum. This value is measured every 10 nm.

Measurement of the Surface Electrical Resistance

The surface electrical resistance (in Ω/□) may be defined by the following formula:

$$R = \frac{\rho}{e} = \frac{1}{\sigma \cdot e}$$

e: thickness of the conductive layer (in cm),
σ: conductivity of the layer (in S/cm) (σ=1/ρ),
ρ: resistivity of the layer (in Ω·cm).

The surface electrical resistance is measured on 20×20 mm specimens using a Keithley 2400 SourceMeter© ohmmeter and on two points to take the measurements. Gold contacts are first deposited on the electrode by CVD, in order to facilitate the measurements.

Measurement of the Coefficient of Haze

The coefficient of haze, expressed as a percentage, is measured on 50×50 mm specimens using a Perkin Elmer Lambda 35 © spectrometer equipped with an integration sphere. This coefficient may be defined by the following formula:

$$H=T_d/T_{mean}*100$$

$T_{mean}$: the mean value of the direct transmittance between 400 and 800 nm.
$T_d$: the value of the diffuse transmittance between 400 and 800 nm. This transmittance Is calculated as the difference between the mean transmittance values with and without the integration sphere.

The lower this ratio, the less the sample scatters light and the more an image observed through the transparent electrode will appear sharp.

Phase Separation Between the Various Polymers

The evaluation of the phase separation between the conductive polymer (a) and the adhesive polymer (b) in the transparent electrode is formed on 50×50 mm specimens using an Olympus BX51 optical microscope at magnification (×100, ×200, ×400). Each specimen is observed by microscope at the various magnifications in its entirety.

Measurement of the Surface Roughness of the Transparent Electrode

The surface roughness of the transparent electrode is performed on 50×50 mm specimens using an atomic force microscopy (AFM) machine. The atomic force microscope scans the surface of the sample with a very fine point. Analysis of the shifts of this point makes it possible to define the topography of the surface of the sample. The mean quadratic roughness (Rq) expressed in nm is then calculated.

2) COMPOSITION OF THE EXAMPLES

Key

| | |
|---|---|
| DMSO | Dimethyl sulfoxide |
| PEDOT:PSS | poly(3,4-ethylenedioxythiophene)-poly(styrenesulfonate) |
| Emultex 378 © | Polyvinyl acetate |
| Revacryl 272 © | Acrylonitrile - acrylic ester copolymer |
| Revacryl 5467 © | Acrylic polyester |
| PVP | Polyvinylpyrrolidone |

Example A 3.3 g of DMSO are added to 20 mg of PVP (diluted to 20% in deionized water) and then stirred for 10 minutes using a magnetic stirrer at 600 rpm. 3 g of PEDOT:PSS containing 1.2% dry extract are then added to the preceding mixture. After stirring for a further 10 minutes, 1.6 g of Emultex 378 © (diluted to 10% in deionized water, dry extract 4.5%, Tg=40° C.) are added to the solution and stirred for 30 minutes.

The mixture obtained is then coated using a scraper onto a glass substrate layer. This deposit is vulcanized at 150° C. for a time of 5 minutes.

Example B 3.3 g of DMSO are added to 20 mg of PVP (diluted to 20% in deionized water) and then stirred for 10 minutes using a magnetic stirrer at 600 rpm. 3 g of PEDOT:PSS containing 1.2% dry extract are then added to the preceding mixture. After stirring for a further 10 minutes, 2.4 g of Revacryl 5467 © (diluted to 10% in deionized water, dry extract 3.0%) are added to the solution and stirred for 30 minutes.

The mixture obtained is then coated using a scraper onto a glass substrate layer. This deposit is vulcanized at 150° C. for a time of 5 minutes.

Counterexample 3.3 g of DMSO are added to 20 mg of PVP (diluted to 20% in deionized water) and then stirred for 10 minutes using a magnetic stirrer at 600 rpm. 3 g of PEDOT:PSS containing 1.2% dry extract are then added to the preceding mixture. After stirring for a further 10 minutes, 1.6 g of Revacryl 272 © (diluted to 10% in deionized water, dry extract 4.5%, Tg=−30° C.) are added to the solution and stirred for 30 minutes.

The mixture obtained is then coated using a scraper onto a glass substrate layer. This deposit is vulcanized at 150° C. for a time of 5 minutes.

3) RESULTS

| | Example A | Example B | Counter-example |
|---|---|---|---|
| $T_{mean}$(%) | 84.8 | 86.0 | 82.6 |
| Coefficient of haze | 1.6 | 2.2 | 5.7 |
| Surface resistance (Ω/□) | 203 | 205 | 201 |
| Roughness: Rq (nm) | 12 | 9 | 28 |
| Phase separation observed by optical microscope | No | No | Yes |

FIG. 3A more particularly shows a microscope photograph of the surface of the multilayer conductive transparent electrode of example A, not showing any phase separation between the conductive polymer (a) and the adhesive polymer (b).

FIG. 3A more particularly shows a microscope photograph of the surface of the multilayer conductive transparent electrode of the counterexample, showing phase separation between the conductive polymer (a) and the adhesive polymer (b), thereby reducing the coefficient of haze and increasing the roughness.

The presence of an adhesive polymer (b) directly in the conductive layer 2 allows direct contact and direct adhesion of said layer to the substrate layer 1 without it being necessary to apply beforehand an additional adhesion layer to said substrate layer 1. This then allows high transmittance since there is absence of an adhesion layer.

Furthermore, the composition of the conductive layer 2 makes it possible, via its simplicity and via the use of an adhesive polymer (b) which has chemical compatibility with the conductive polymer, to have a multilayer conductive transparent electrode which has a low coefficient of haze and a roughness that is also low, without this excessively harming the surface resistance, which remains low, even in the absence of a network of metal nanofilaments.

This multilayer conductive transparent electrode thus has high transmittance, a low coefficient of haze and a roughness that is also low, for a reduced cost since the composition is simpler and requires fewer manufacturing steps.

The invention claimed is:

1. A multilayer conductive transparent electrode having first and second opposing surfaces, the multilayer conductive transparent electrode comprising:
   a substrate layer having a second surface corresponding to the second surface of the multilayer conductive transparent electrode and a first opposing surface;
   a conductive layer having a first surface corresponding to the first surface of the multilayer conductive transparent electrode and a second opposing surface, wherein the second surface of the conductive layer is disposed over and in direct contact with the first surface of the substrate layer, the conductive layer comprising:
      at least one polythiophene conductive polymer, and
      at least one hydrophobic adhesive polymer which has chemical compatibility with the polythiophene conductive polymer such that the multilayer conductive transparent electrode has a coefficient of haze of less than or equal to about three percent, wherein the hydrophobic adhesive polymer comprises a material that includes at least one of polyvinyl acetates and acrylic polyesters.

2. The multilayer conductive transparent electrode as claimed in claim 1 wherein the conductive layer further comprises at least one additional polymer.

3. The multilayer conductive transparent electrode as claimed in claim 2 wherein the additional polymer is polyvinylpyrrolidone.

4. The multilayer conductive transparent electrode as claimed in claim 1 wherein the multilayer conductive transparent electrode has a mean transmittance over wavelengths in visible spectrum of greater than or equal to about seventy five percent.

5. The multilayer conductive transparent electrode as claimed in claim 1 wherein at least one of the first and second surfaces of the multilayer conductive transparent electrode has a surface roughness of less than about twenty nanometers (nm).

6. The multilayer conductive transparent electrode as claimed in claim 1 wherein at least one of the first and second surfaces of the multilayer conductive transparent electrode has a surface resistance of less than or equal to about one-thousand ohms per square ($\Omega/\square$) and greater than or equal to about fifty $\Omega/\square$.

7. The multilayer conductive transparent electrode as claimed in claim 1 wherein the substrate layer comprises a material that includes at least one of glass and transparent flexible polymers.

8. A process for manufacturing a multilayer conductive transparent electrode having first and second opposing surfaces, the process comprising:
   providing a substrate layer having a second surface corresponding to the second surface of the multilayer conductive transparent electrode and a first opposing surface;
   preparing a conductive layer composition, the conductive layer composition comprising:
      at least one polythiophene conductive polymer, and
      at least one hydrophobic adhesive polymer which has chemical compatibility with the polythiophene conductive polymer such that the multilayer conductive transparent electrode has a coefficient of haze of less than or equal to about three percent, wherein the hydrophobic adhesive polymer comprises a material that includes at least one of polyvinyl acetates and acrylic polyesters;
   disposing the conductive layer composition directly over the first surface of the substrate layer and drying the conductive layer composition to form a conductive layer having a first surface corresponding to the first surface of multilayer conductive transparent electrode and a second opposing surface, and
   crosslinking the conductive layer to form a multilayer conductive transparent electrode comprising at least the substrate layer and the conductive layer.

9. The process for manufacturing a multilayer conductive transparent electrode as claimed in claim 8 wherein the conductive layer composition further comprises at least one additional polymer.

10. The process for manufacturing a multilayer conductive transparent electrode as claimed in claim 9 wherein the additional polymer is polyvinylpyrrolidone.

11. The process for manufacturing a multilayer conductive transparent electrode as claimed in claim 8 wherein the substrate layer comprises a material that includes at least one of glass and transparent flexible polymers.

* * * * *